(12) United States Patent
Nam et al.

(10) Patent No.: US 8,692,263 B2
(45) Date of Patent: Apr. 8, 2014

(54) ORGANIC LIGHT EMITTING DIODE DISPLAY AND MANUFACTURING METHOD THEREOF

(75) Inventors: Kie Hyun Nam, Yongin (KR); Sang-Soo Kim, Yongin (KR); Choong-Ho Lee, Yongin (KR); Jung-Min Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 120 days.

(21) Appl. No.: 13/276,218

(22) Filed: Oct. 18, 2011

(65) Prior Publication Data

US 2012/0146061 A1  Jun. 14, 2012

(30) Foreign Application Priority Data

Dec. 14, 2010 (KR) .................. 10-2010-0127645

(51) Int. Cl.
*H01L 33/00* (2010.01)
*H01L 27/15* (2006.01)
*H01L 31/12* (2006.01)
*H01L 51/00* (2006.01)
*H01L 23/58* (2006.01)

(52) U.S. Cl.
USPC ................ 257/88; 257/40; 257/79; 257/642; 257/643

(58) Field of Classification Search
USPC ........... 257/88, 40, 91, 72, 59, 350, 642, 643, 257/759
See application file for complete search history.

(56) References Cited

U.S. PATENT DOCUMENTS

| | | |
|---|---|---|
| 6,998,776 B2 | 2/2006 | Aitken et al. |
| 7,537,504 B2 | 5/2009 | Becken et al. |
| 2003/0038590 A1* | 2/2003 | Silvernail et al. ............. 313/504 |
| 2012/0025700 A1* | 2/2012 | Ryu et al. ...................... 313/512 |

FOREIGN PATENT DOCUMENTS

| | | |
|---|---|---|
| JP | 11-233255 A | 8/1999 |
| JP | 2001-296814 A | 10/2001 |
| KR | 10-2008-0042094 A | 5/2008 |
| KR | 10-2008-0088031 A | 10/2008 |

* cited by examiner

*Primary Examiner* — Chuong A. Luu
(74) *Attorney, Agent, or Firm* — Knobbe, Martens, Olson & Bear, LLP (57) ABSTRACT

A large size organic light emitting diode (OLED) display and manufacturing method thereof are disclosed. In one embodiment, the method includes i) forming a display unit including a plurality of pixels on a substrate, ii) forming a getter layer, a bonding layer and a conductive contact layer around the display unit and iii) manufacturing a sealing member including a flexible polymer film and a metal layer formed on at least one side of the polymer film. The method may further include laminating the sealing member on the substrate using a roll lamination process such that the metal layer contacts the conductive contact layer and curing the contact layer and the conductive contact layer.

7 Claims, 13 Drawing Sheets

ORGANIC LIGHT EMITTING DIODE DISPLAY AND MANUFACTURING METHOD THEREOF

RELATED APPLICATIONS

This application claims priority to and the benefit of Korean Patent Application No. 10-2010-0127645 filed in the Korean Intellectual Property Office on Dec. 14, 2010, the entire contents of which are incorporated herein by reference.

BACKGROUND

1. Field

The described technology generally relates to an organic light emitting diode (OLED) display, more particularly, an OLED display, having a sealing member sealing a display unit, and manufacturing method thereof.

2. Description of the Related Technology

An OLED display generates images using self-emission organic light emitting elements. Functions of an OLED display are deteriorated when the display is exposed to moisture and oxygen, and thus it is important to seal the display to suppress the infiltration of external moisture and oxygen. Furthermore, as the area of the OLED display increases, a light thin sealing structure having excellent productivity is required.

The above information disclosed in this Background section is only for enhancement of understanding of the background of the described technology and therefore it may contain information that does not form the prior art that is already known in this country to a person of ordinary skill in the art.

SUMMARY

One inventive aspect is an OLED display having advantages of improving the sealing performance of a display unit to increase display quality and life-span of the display unit and supply power to the display unit using a sealing structure, and manufacturing method thereof.

Another aspect is a method of manufacturing an OLED display comprising: forming a display unit including a plurality of pixels on a substrate; forming a getter layer, a bonding layer and a conductive contact layer around the display unit; manufacturing a sealing member including a flexible polymer film and a metal layer formed on at least one side of the polymer film; laminating the sealing member on the substrate using a roll lamination process such that the metal layer comes into contact with the conductive contact layer; and curing the contact layer and the conductive contact layer.

The display unit may have a diagonal length of more than about 700 mm. The polymer film may be formed to a thickness in the range of about 1 µm to about 300 µm. The getter layer, the bonding layer and the conductive contact layer may be sequentially disposed from the display unit.

The method of manufacturing an OLED may further comprise forming one of a moisture-absorbing filler and an additional bonding layer on one side of the sealing member, which faces the display unit, before the roll lamination process. The moisture-absorbing filler and the additional bonding layer may be formed in a size smaller than the space inside the bonding layer and covering the display unit and the getter layer.

A first pad part and a second pad part may be formed in regions overlapping the conductive contact layer when the display unit is manufactured and the first pad part and the second pad part may be connected to the display unit.

The display unit may include a common electrode and a common power line, the first pad part may be connected to the common electrode and the second pad part may be connected to the common power line. The first pad part and the second pad part may be arranged at a distance from each other surround the display unit.

The sealing member may include a first metal layer disposed on the inner side of the polymer film and connected to the first pad part through the conductive contact layer and a second metal layer coming into contact with the conductive contact layer in a region other than the first metal layer and connected to the second pad part.

The sealing member may further include a first connector and a second connector which extend through the polymer film, a third metal layer disposed on the outer side of the polymer film and connected to the first metal layer through the first connector, and a fourth metal layer connected to the second metal layer through the second connector.

The sealing member may include a fifth conductive layer disposed on the inner side of the polymer film and a sixth conductive layer disposed on the outer side of the polymer film. The fifth conductive layer and the sixth conductive layer may come into contact with the conductive contact layer in different positions and may be respectively connected to the first pad and the second pad part.

The sealing member may be manufactured through a roll-to-roll continuous process.

Another aspect is an OLED display comprising a substrate, a display unit formed on the substrate and including a plurality of pixels, a conductive contact layer disposed around the display unit at a distance from the display unit, and a sealing member facing the display unit and fixed onto the substrate through the conductive contact layer. The sealing member comprises a flexible polymer film and a plurality of metal layers formed on at least one side of the polymer film and connected to the display unit through the conductive contact layer.

The polymer film may have a thickness in the range of 1 µm to 300 µm. The display unit may have a diagonal length of more than 700 mm. The conductive contact layer may surround the display unit and a bonding layer, a getter layer and a moisture-absorbing filler may be disposed inside the conductive contact layer.

The display unit may include a common electrode and a common power line, and a first pad part connected to the common electrode and a second pad part connected to the common power line may be formed under the conductive contact layer.

The conductive contact layer may have electrical conductivity in the thickness direction of the substrate and have insulating property in other directions.

The sealing member may include a first metal layer disposed on the inner side of the supporting layer and connected to the first pad part through the conductive contact layer and a second metal layer disposed in a region other than the first metal layer and connected to the second pad part through the conductive contact layer.

The sealing member may include a first connector and a second connector which extend through the supporting layer, a third metal layer disposed on the outer side of the supporting layer and connected to the first metal layer through the first connector, and a fourth metal layer connected to the second metal layer through the second connector.

The sealing member may include a fifth conductive layer disposed on the inner side of the polymer film and a sixth conductive layer disposed on the outer side of the polymer film. The fifth conductive layer and the sixth conductive layer may come into contact with the conductive contact layer in different positions and may be respectively connected to the first pad and the second pad part.

The sealing member is composed of the flexible polymer film and the metal layers, and thus the sealing member can be easily manufactured through the roll-to-roll continuous process. Furthermore, the seal member can be easily attached onto the substrate through the roll lamination process. The roll-to-roll process and the roll lamination process are very advantageous to manufacture wide-area display devices.

Further, an electric signal is provided to the common electrode and the common power line of the display unit through the metal layer of the sealing member, and thus the overall structure and manufacturing process of the OLED display can be simplified

DETAILED DESCRIPTION

Embodiments will be described more fully hereinafter with reference to the accompanying drawings. As those skilled in the art would realize, the described embodiments may be modified in various different ways.

The drawings and description are to be regarded as illustrative in nature and not restrictive. Like reference numerals designate like elements throughout the specification. Accordingly, the drawings and description are to be regarded as illustrative in nature and not restrictive. Like reference numerals designate like elements throughout the specification.

It will be understood that when an element such as a layer, film, region, or substrate is referred to as being "on" another element, it can be directly on the other element or intervening elements may also be present.

Throughout this specification and the claims that follow, when it is described that an element is "coupled" to another element, the element may be "directly coupled" to the other element or "electrically coupled" to the other element through a third element.

FIGS. 1 to 5 are schematic diagrams showing a process of manufacturing an OLED display according to a first embodiment.

Figure 1:
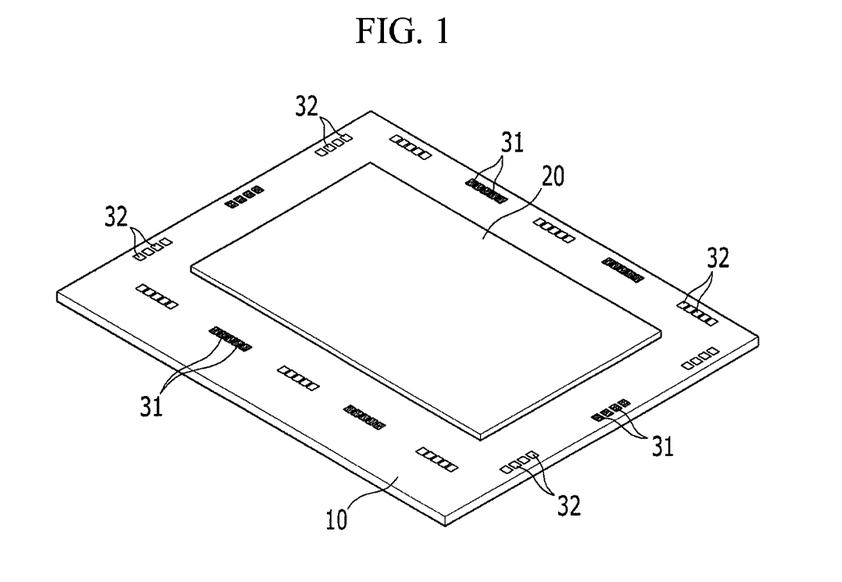
FIGS. 1 to 5 are schematic diagrams showing a process of manufacturing an OLED display according to a first embodiment.

Referring to FIG. 1, a display unit 20 including a plurality of pixels is formed on a substrate 10. The substrate 10 may be formed of transparent glass or a transparent polymer. Light from the display unit 20 transmits the substrate 10 to be emitted to the outside of the display unit 20.

Each pixel in the display unit 20 has a driving circuit and an organic light emitting element controlled by the driving circuit. The driving circuit may have at least two thin film transistors including a switching thin film transistor and a driving thin film transistor and at least one capacitor. The organic light emitting element includes a pixel electrode, an organic emission layer and a common electrode.

One of the pixel electrode and the common electrode is a hole injection electrode injecting a hole into a organic emission layer, and the other is an electron injection electrode injecting an electrode into a organic emission layer. Light is emitted when excitons generated from combinations of the injected holes and electrons into the organic emission layer drop from the excited state to the ground state. The pixel electrode is formed for each pixel and connected to the driving thin film transistor of the corresponding pixel. The common electrode is commonly formed over the plurality of pixels.

In addition, the display unit 20 includes a gate line, a data line and a common power line for each pixel. The gate line transits a scan signal and the data line transmits a data signal. The common power line applies a common voltage to the driving thin film transistor. The common power line includes a first common power line and a second common power line perpendicular to each other. The detailed structure of the display unit 20 will be described later. FIG. 1 shows the display unit 20 a simplified layer for convenience of description.

First pad parts 31 and second pad parts 32 are formed around the display unit 20 at the same time when the display unit 20 is formed on the substrate 10. The first pad parts 31 are connected to the common electrode of the display unit 20 and the second pad parts 32 are connected to the common power line of the display unit 20. The first and second pad parts 31 and 32 are located outside the four edges of the display unit 20 to surround the display unit 20 and arranged in substantially parallel at intervals.

The connection structure of the common electrode and the first pad parts 31 and the connection structure of the common power line and the second pad parts 32 will be described later. FIG. 1 shows the first pad parts 31 in a dot pattern to distinguish the first pad parts 31 from the second pad parts 32. The first and second pad parts 31 and 32 shown in FIG. 1 are simplified and the positions and numbers of the first pad parts 31 and the second pad parts 32 are not limited thereto.

Figure 2:
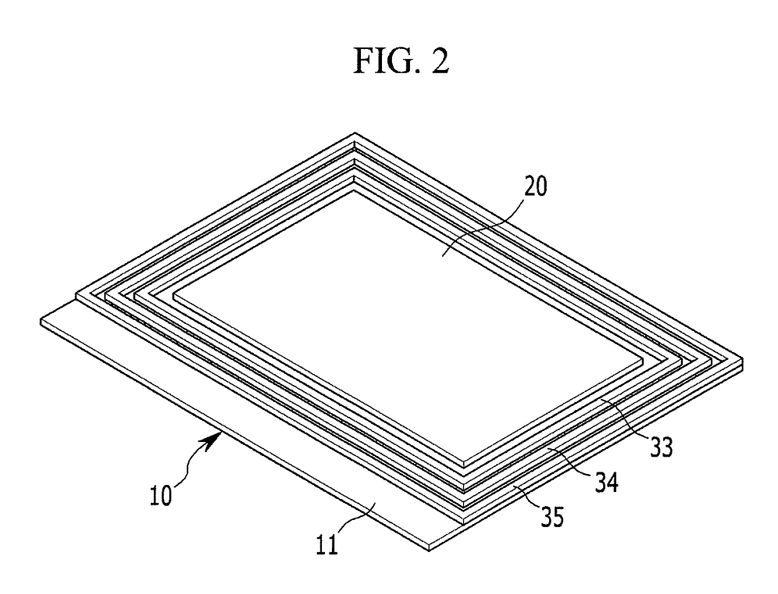

Referring to FIG. 2, a getter layer 33, a bonding layer 34 and a conductive contact layer 35 are formed around the display unit 20. The getter layer 33, the bonding layer 34 and the conductive contact layer 35 may be formed by coating a liquid or paste material on the substrate 10 using a dispenser or screen printer and drying the material.

The getter layer 33 includes a getter material absorbing moisture and oxygen. In one embodiment, the getter material includes barium oxide, calcium oxide, magnesium oxide, sodium oxide, potassium oxide, lithium sulfate, sodium sulfate, calcium sulfate, magnesium sulfate, potassium sulfate, potassium chlorate, magnesium chlorate, calcium bromide, cesium bromide, vanadium bromide and calcium nitrate. The getter layer 33 may be located nearest to the display unit 20 to suppress infiltration of moisture and oxygen into the display unit 20.

The bonding layer 34 is located around the getter layer 33 and the conductive contact layer 35 is placed around the bonding layer 34. In one embodiment, the bonding layer 34 and the conductive contact layer 35 are formed of UV resin or thermosetting resin. For example, the thermosetting resin includes epoxy resin.

The conductive contact layer 35 is formed on and contacts the first and second pad parts 31 and 32. Here, the conductive contact layer 35 shows conductivity in the thickness direction of the substrate 10 (vertical direction in FIG. 2) and shows insulating property in other directions. Accordingly, even if the conductive contact layer 35 comes into contact with both of the pad parts 31 and 32, the two pad parts 31 and 32 do not short-circuit.

The substrate 10 includes a pad area 11 located at one edge thereof and one edge of the conductive contact layer 35. The pad area 11 is an area in which pad electrodes (not shown) extended from electrodes of the display unit 20 are located and has a chip on film (COF) connected to a PCB or a flexible printed circuit (FPC) mounted thereon.

Figure 3A:
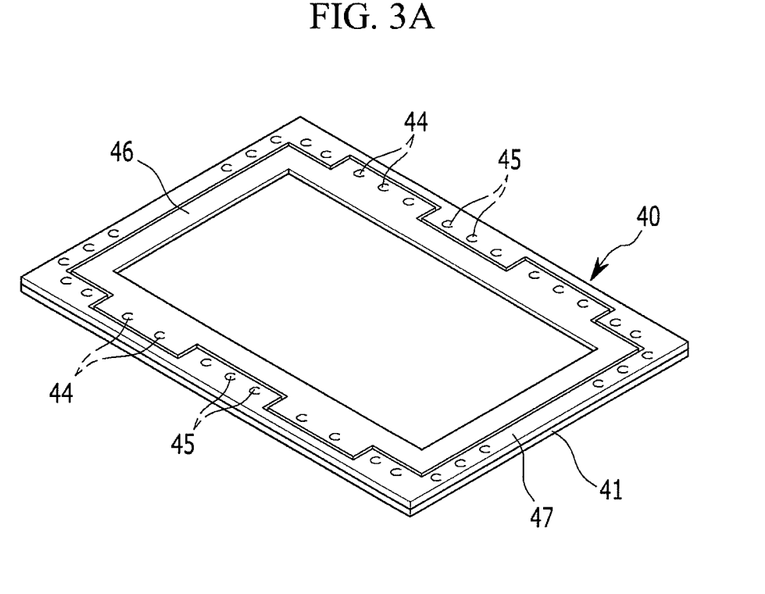
Figure 3B:
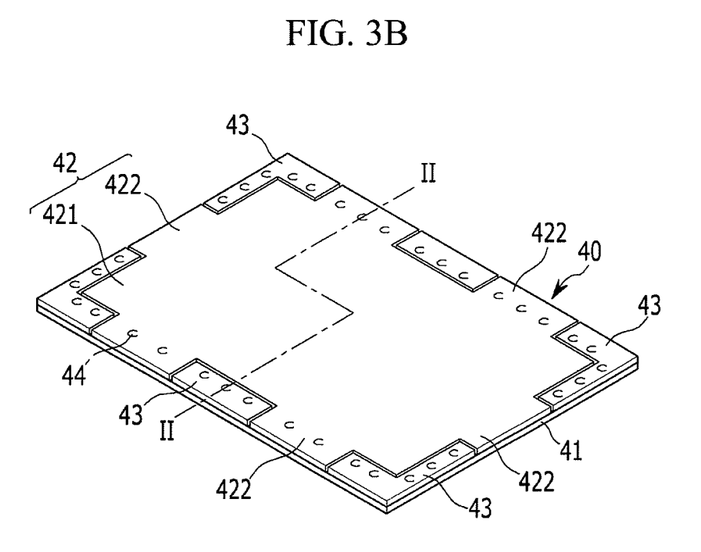
Figure 3C:
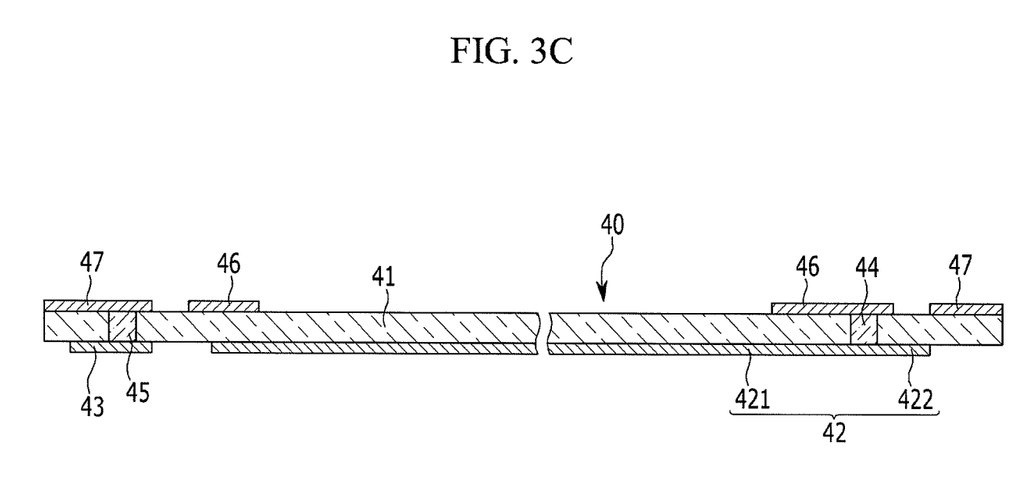

Referring to FIGS. 3A, 3B and 3C, the sealing member 40 including the flexible polymer film 41 and a plurality of metal layers formed on both sides of the polymer film 41 is manufactured. FIG. 3A is a perspective view showing the outer side of the sealing member 40, FIG. 3B is a perspective view showing the inner side of the sealing member 40, and FIG. 3C is a cross-sectional view taken along line II-II of FIG. 12B. Here, 'inner side' of the sealing member 40 means the side facing the display unit 20 in the accomplished OLED display.

The polymer film 41 may be formed of a polymer material having low moisture and oxygen permeability and formed to a thickness easily bent by an external force. The polymer film 41 may include at least one of polyethyleneterephthalate, polyethylenenaphthalate, polyimide and polycarbonate.

Furthermore, the polymer film 41 may be formed of resin matrix impregnated with a reinforcing fiber. The reinforcing fiber may include one of glass fiber and aramid fiber. The resin matrix may include at least one of polyethyleneterephthalate, polyethylenenaphthalate, polyimide and polycarbonate.

The polymer film 41 may be formed to a thickness of about 1 μm to about 300 μm. If the thickness of the polymer film 41 is less than about 1 μm, the polymer film 41 may be damaged during a roll lamination process which will be explained later. If the thickness of the polymer film 41 exceeds about 300 μm, the flexibility of the polymer film 41 may be deteriorated to result in a difficulty in smoothly performing the roll lamination process. However, depending on the embodiment, the thickness of the polymer film 41 may be greater than about 300 μm or less than about 1 μm.

The metal layers of the sealing member 40 are inorganic layers that moisture and oxygen cannot permeate and seal the display unit 20 with the bonding layer 34. Furthermore, the metal layers have a function of respectively applying the first and second electric signals to the common electrode and the common power line of the display unit 20 in addition to the sealing function. Specifically, first and second metal layers 42 and 43 are located at a distance from each other on the inner side of the polymer film 41.

The first metal layer 42 includes a first center part 421 having a size corresponding to the display unit 20, the getter layer 33 and the bonding layer 34 and facing the display unit 20, the getter layer 33 and the bonding layer 34 and a plurality of third pad parts 422 arranged at intervals along the edge of the first center part 421. The third pad parts 422 are formed in positions corresponding to the first pad parts 31 on the substrate 10 and come into contact with the conductive contact layer 35 later.

The second metal layer 43 includes a plurality of parts each of which is located between neighboring third pad parts 422. The second metal layer 43 is formed in positions corresponding to the second pad parts 32 on the substrate 10 and come into contact with the conductive contact layer 35 later.

Before the first and second metal layers 42 and 43 are bonded to the polymer film 41, penetration holes are formed in portions of the polymer film 41, which correspond to the first metal layer 42 and the second metal layer 43, and filled with a conductive material to form a first connector 44 and a second connector 45 which extend through the polymer film 41. The first metal layer 42 is in contact with the first connector 44 and the second metal layer 43 is in contact with the second connector 45.

A third metal layer 46 and a fourth metal layer 47 are arranged at a distance from each other on the outer side of the polymer film 41. The third metal layer 46 is connected to the first metal layer 42 through the first connector 44. The fourth metal layer 47 is connected to the second metal layer 43 through the second connector 45. The fourth metal layer 47 may be formed in a rectangular frame shape along the edge of the polymer film 41 and the third metal layer 46 may be formed in substantially parallel with the fourth metal layer 47 inside the fourth metal layer 47.

External connecting terminals (not shown) are bonded to the third and fourth metal layers 46 and 47. Accordingly, the first electric signal provided to the third metal layer 46 through the external connecting terminal corresponding to the third metal layer 46 is transmitted to the first metal layer 42. Furthermore, the second electric signal provided to the fourth metal layer 47 through the external connecting terminal corresponding to the fourth metal layer 47 is transmitted to the second metal layer 43. The first, second, third and fourth metal layers 42, 43, 46 and 47 may be formed of metal foil including aluminum (Al) or copper (Cu) and bonded to the polymer film 41 through an adhesive layer (not shown).

The aforementioned sealing member 40 may be manufactured through a roll-to-roll process. In one embodiment, the roll-to-roll process includes i) unrolling the polymer film 41 wound around a roll, ii) transferring the unrolled polymer film 41 between a first driving roll and a second driving roll to attach the first and second metal layers 42 and 43 to one side of the polymer film 41 and bonding the third and fourth metal layers 46 and 47 to the other side of the polymer film 41.

Figure 4:
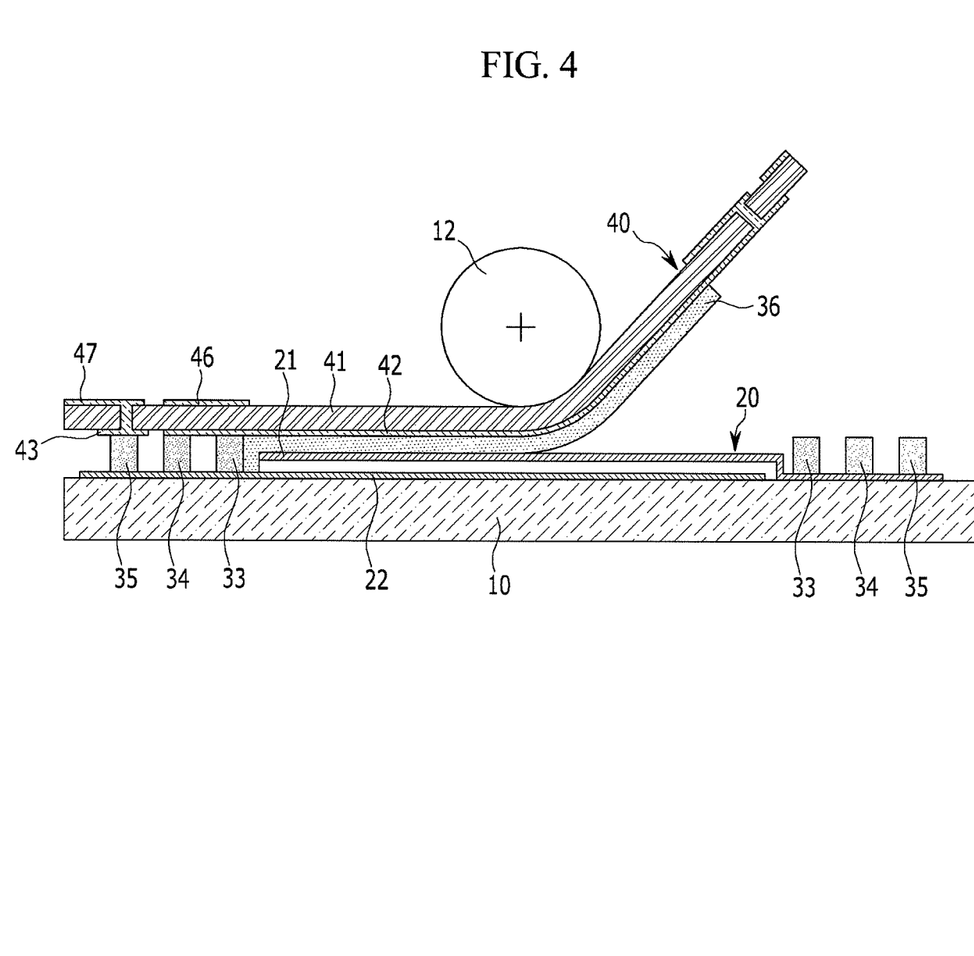

Referring to FIG. 4, the substrate 10 on which the display unit 20 is formed is mounted on a fixing table (not shown) and the sealing member 40 is laminated on the substrate 10 through the roll lamination process using a press roll 12.

Referring to FIG. 4, a moisture-absorbing filler 36 is formed on the inner side of the sealing member 40, which faces the display unit 20, in advance before the sealing member 40 is laminated on the substrate 10. The moisture-absorbing filler 36 is formed in an area smaller than the space inside the bonding layer 34 and in a size covering the display unit 20 and the getter layer 33. An additional bonding layer including epoxy resin may replace the moisture-absorbing filler 36.

The sealing member 40 includes the flexible polymer film 41 and the metal layers 42, 43, 46 and 47, and thus the sealing member 40 can be easily manufactured through the roll-to-roll continuous process. Furthermore, the seal member 40 can be easily attached onto the substrate 10 through the roll lamination process. The roll-to-roll process and the roll lamination process are very advantageous to manufacture wide-area display devices.

Figure 5:
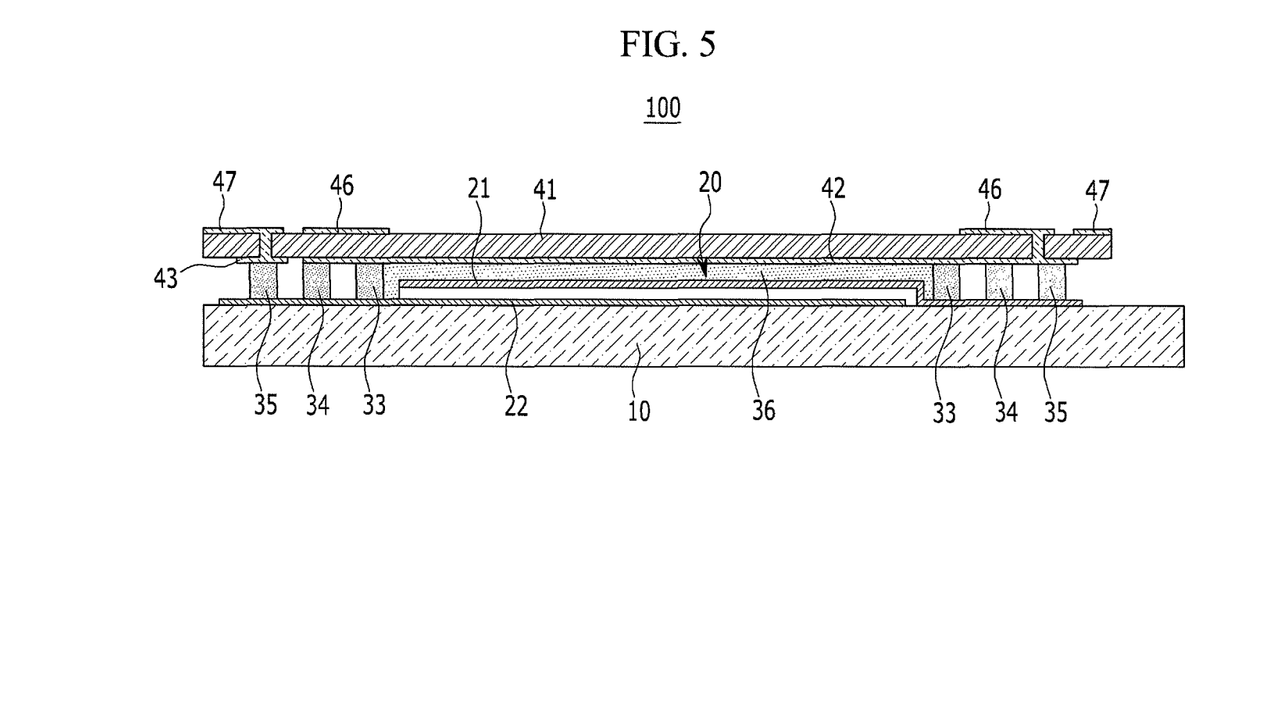

Referring to FIG. 5, after the sealing member 40 is laminated on the substrate 10, the bonding layer 34 and the conductive contact layer 35 are thermally cured to bond the substrate 10 and the sealing member 40 to each other. A press plate (not shown) may be arranged on the substrate 10 and the sealing member 40 to press the bonding layer 34 and the conductive contact layer 35 during the thermal curing. The OLED display 100 is accomplished through the above-described process.

The OLED display 100 is a large-size display device including the display unit 20 having a diagonal length of greater than about 700 mm.

The OLED display 100 can be easily manufactured through a simplified manufacturing method at low costs by using the roll-to-roll process and the roll lamination process advantageous to manufacture large-size display devices.

Referring to FIGS. 1 through 5, the third pad parts 422 of the first metal layer 42 are connected to the first pad parts 31 through the conductive contact layer 35 and coupled to the common electrode 21. The second metal layer 43 is connected to the second pad parts 32 through the conductive contact layer 135 and coupled to the common power line 22. FIGS. 4 and 5 show the display unit 20 including the common electrode 21 and the common power line 22 in a three-layer structure.

Accordingly, the first electric signal applied to the third metal layer 46 is transmitted to the common electrode 21 via the first metal layer 42 and the first pad parts 31, and the second electric signal applied to the fourth metal layer 47 is transmitted to the common electrode 21 via the second metal layer 43 and the second pad parts 32.

In this process, the first and second pad parts 31 and 32 surround the display unit 20, and thus the common electrode 21 and the common power line 22 respectively receive the first electric signal and the second electric signal from the outside of the four edges of the display unit 20. Accordingly, the OLED display 100 according to the first embodiment can improve luminance uniformity of the display unit 20 while achieving the large-size display unit 20.

If the common power line 22 and the common electrode 21 are connected to a chip on film mounted on the pad area 11 through their wires and receive the electric signals from the chip on film, the luminance uniformity of the display unit 20 is deteriorated since wire resistance increases as the area of the display unit 20 increases. Accordingly, it is required to form the pad area 11 at all the four edges of the substrate 10 to improve the luminance uniformity of the display unit 20. In this case, the overall structure and manufacturing process of the display unit 20 become complicated and the manufacturing cost increases.

However, the OLED display 100 according to the first embodiment can improve the luminance uniformity of the large-size display unit 20 even though the pad area 11 is located at one edge of the substrate 10, and thus the overall structure and manufacturing process of the display unit 20 can be simplified and the manufacturing cost can be reduced.

In the above-described OLED display 100, the component such as external moisture or oxygen, which infiltrates along the thickness direction of the sealing member 40 (vertical direction in FIG. 5), is blocked by the polymer film 41, the first metal layer 42 and the moisture-absorbing filler 36. In addition, the component infiltrating along the surface direction of the substrate 10 (horizontal direction in FIG. 14) between the substrate 10 and the sealing member 40 is blocked by the conductive contact layer 35, the bonding layer 34, the getter layer 33 and the moisture-absorbing filler 36.

That is, the OLED display 100 includes multi-layer blocking structures formed in the thickness direction of the sealing member 40 and the surface direction of the substrate 10, and thus the sealing performance of the display unit 20 can be improved. Accordingly, deterioration of the display unit 20 due to moisture and oxygen can be suppressed so as to improve the display quality and life-span of the display unit 20.

Figure 6:
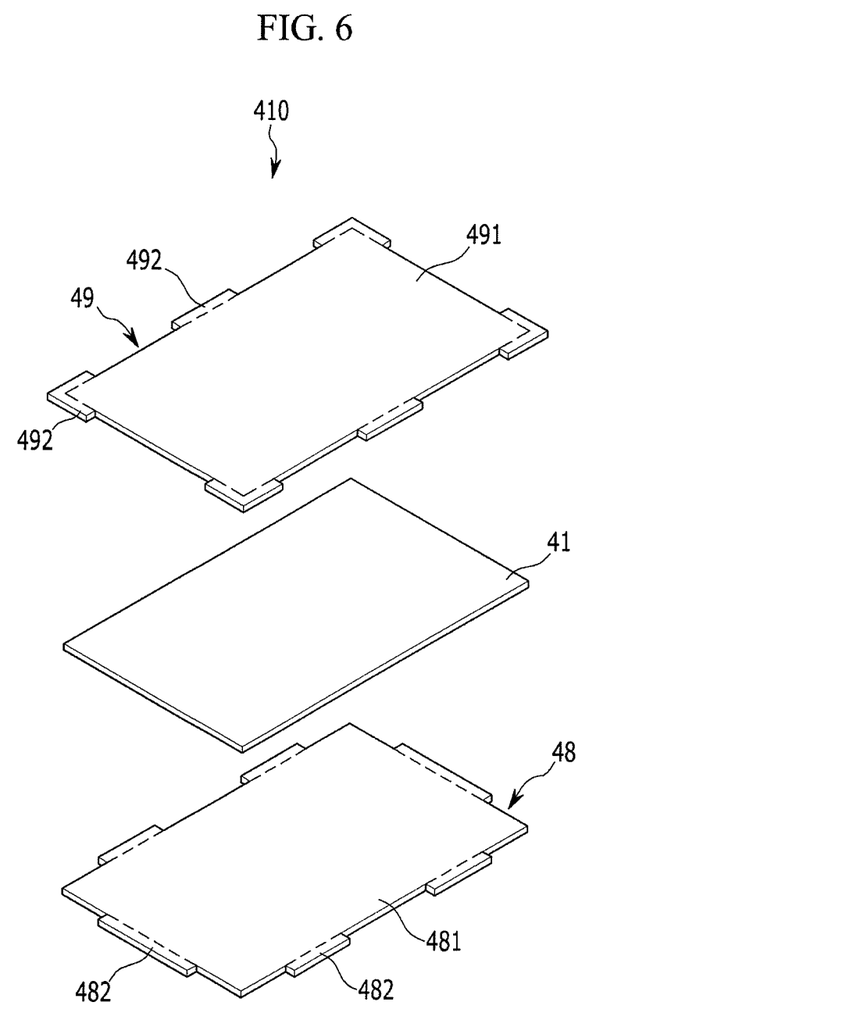
FIG. 6 is an exploded perspective view of a sealing member of the OLED display according to a second embodiment.
Figure 7:
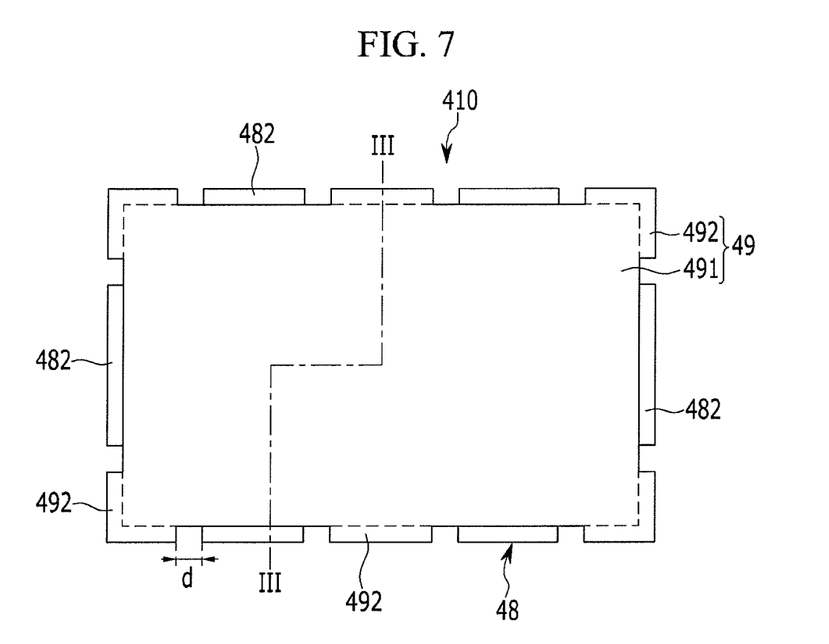
FIG. 7 is a top plan view of a sealing member of an OLED display according to the second embodiment.
Figure 8:
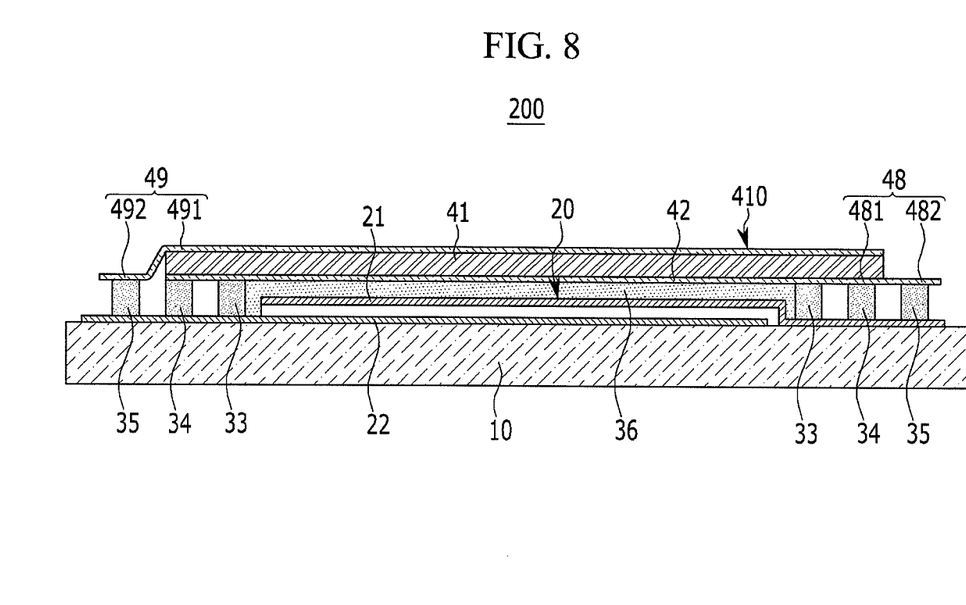
FIG. 8 is a cross-sectional view of an OLED display according to the second embodiment.

FIG. 6 is an exploded perspective view of a sealing member of an OLED display 200 according to a second embodiment, FIG. 7 is a top plan view of the sealing member of the OLED display 200 according to the second embodiment, and FIG. 8 is a cross-sectional view of the OLED display 200 according to the second embodiment.

Referring to FIGS. 6, 7, and 8, the sealing member 410 of the OLED display 200 includes the polymer film 41 having no penetration holes formed therein, a fifth metal layer 48 formed on the inner side of the polymer film 41 and a sixth metal layer 49 formed on the outer side of the polymer film 41. Elements of the OLED display 200 other than the sealing member 410 are identical to those of the OLED 100 except the sealing member 410.

The fifth metal layer 48 includes a first center part 481, which is formed in a size corresponding to the display unit 20, the getter layer 33 and the bonding layer 34 and faces the display unit 20, the getter layer 33 and the bonding layer 34, and a plurality of fifth pad parts 482 disposed at intervals along the edge of the fifth center part 481. The fifth pad parts 482 are formed in positions corresponding to the first pad parts 31 on the substrate 10 and connected to the first pad parts 31 through the conductive contact layer 35. Accordingly, the fifth metal layer 48 is connected to the common electrode 21 of the display unit 20.

The sixth metal layer 49 includes a sixth center part 491 superposed on the fifth center part 481 and a plurality of sixth pad parts 492 disposed at intervals along the edge of the sixth center part 491. The sixth pad parts 492 are formed in positions corresponding to the second pad parts 32 on the substrate 10 and connected to the second pad parts 32 through the conductive contact layer 35. Accordingly, the sixth metal layer 49 is connected to the common power line 22 of the display unit 20.

The fifth and sixth pad parts 482 and 492 are formed in different regions such that the sixth pad parts 492 are not superposed on the fifth pad parts 482 and formed at intervals of d shown in FIG. 7 along the edge of the sealing member 410 such that the fifth pad parts 482 and the sixth pad parts 492 are not in contact with each other. The polymer film 41 is disposed between the fifth and sixth center parts 481 and 491 and an adhesive layer (not shown) may be located between the fifth center part 481 and the polymer film 41 and between the polymer film 41 and the sixth center part 491.

The above-described sealing member 410 does not require penetration holes formed in the polymer film 41, and thus the layout of the metal layers 48 and 49 and the manufacturing process of the OLED display 200 can become simpler than those of the OLED display 100. The sealing member 410 is manufactured through the roll-to-roll continuous process and attached onto the substrate 10 through the roll lamination process.

Figure 9:
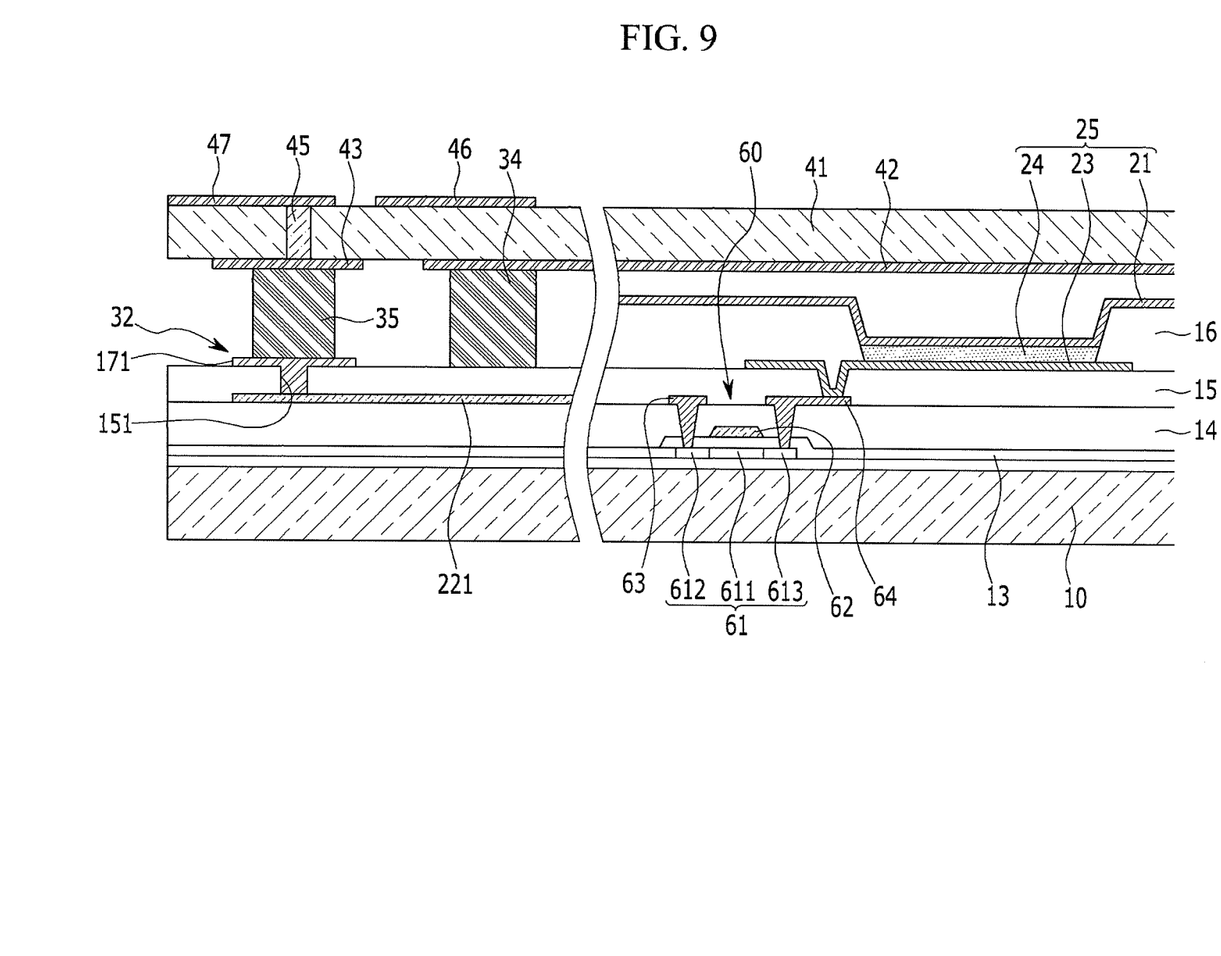
FIGS. 9, 10 and 11 are cross-sectional views of the OLED display shown in FIG. 5.
Figure 10:
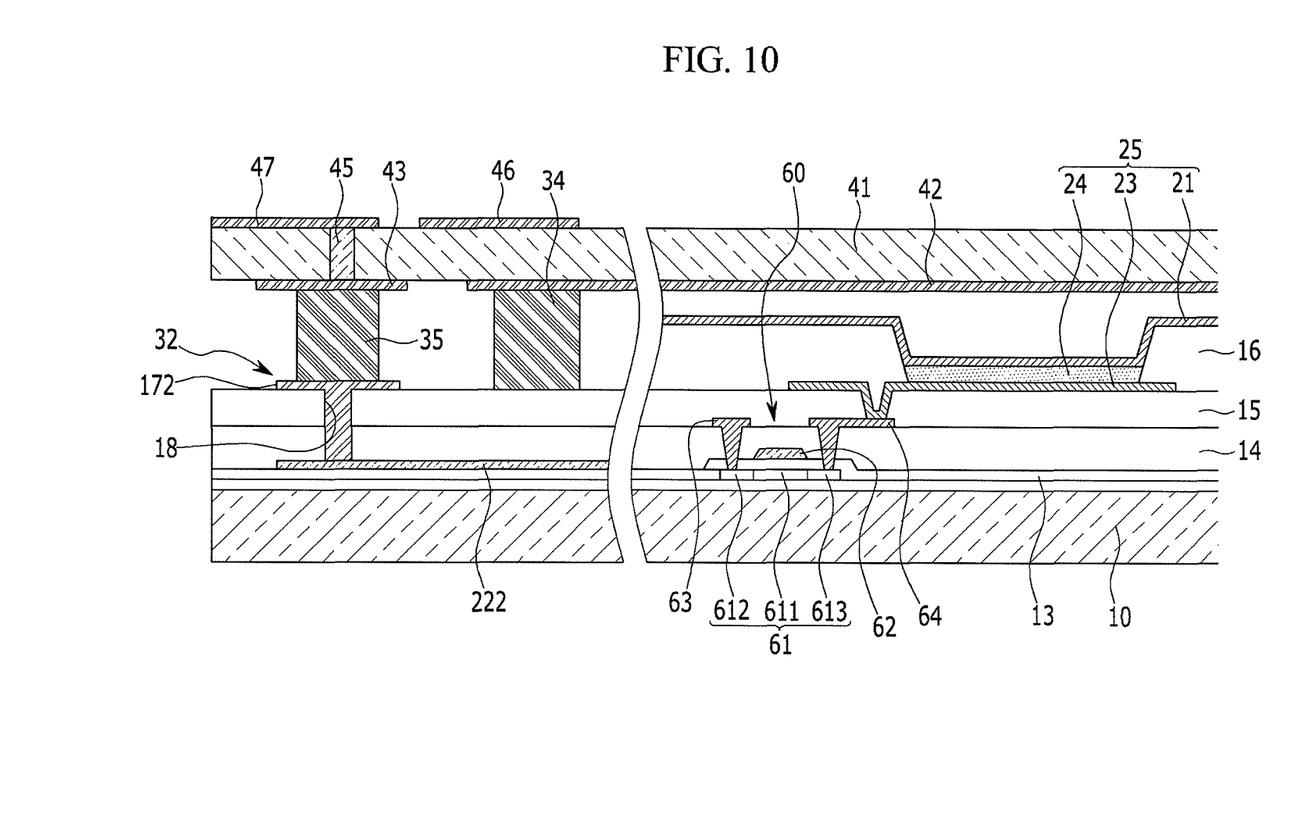
Figure 11:
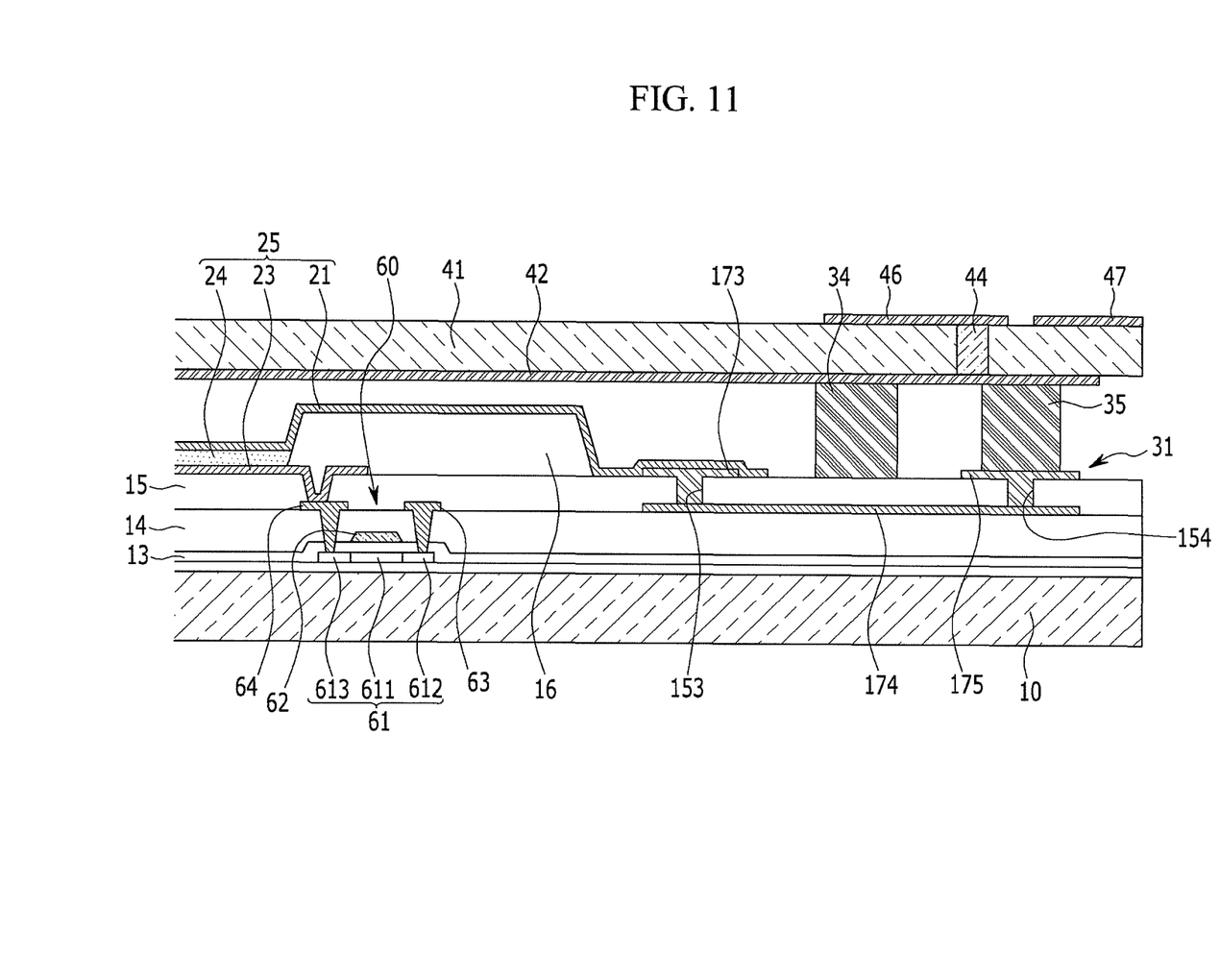

FIGS. 9, 10 and 11 are cross-sectional views of the OLED display shown in FIG. 5. FIG. 9 shows the first common power line 221 and the first pad parts, FIG. 10 shows the second common power line 222 and the first pad parts 31, and FIG. 11 shows the common electrode 21 and the second pad parts 32.

Referring to FIGS. 9, 10 and 11, an organic light emitting element 25 and a driving circuit are formed in each pixel of the display unit, as described above. The driving circuit includes at least two thin film transistors and at least one capacitor. FIGS. 9, 10 and 11 show a single thin film transistor 60 and the single organic light emitting element 25 disposed in the display unit, and the getter layer 33 is not shown.

The thin film transistor 60 includes a semiconductor layer 61, a gate electrode 62, a source electrode 63 and a drain electrode 64. The semiconductor layer 61 is formed of polysilicon and includes a channel region 611, a source region 612 and a drain region 613. The channel region 611 is an intrinsic semiconductor and the source and drain regions 612 and 613 correspond to an impurity-undoped semiconductor.

The gate electrode 62 is disposed on the channel region 611 of the semiconductor layer 61 with the gate insulating layer 13 interposed therebetween. The source electrode 63 and the drain electrode 64 are disposed on the gate electrode 62 with an interlayer insulating film 14 formed therebetween and respectively connected to the source region 612 and the drain region 613 through contact holes formed in the interlayer insulating film 14. A planarization layer 15 is formed on the source electrode 63 and the drain electrode 64 and a pixel electrode 23 is disposed on the planarization layer 15. The pixel electrode 23 is connected to the drain electrode 64 through a contact hole formed in the planarization layer 15.

A pixel defining layer 16 is disposed on the pixel electrode 23 and the planarization layer 15. The pixel defining layer 16 includes an opening corresponding to each pixel and exposes part of the pixel electrode 23 through the opening. An organic emission layer 24 is formed on the exposed portion of the pixel electrode 23 and the common electrode 21 is formed on the overall display unit to cover the organic emission layer 24 and the pixel defining layer 16. The pixel electrode 23, the organic emission layer 24 and the common electrode 21 form the organic light emitting element 25.

The pixel electrode 23 may be a hole injection electrode and the common electrode 21 may be an electron injection electrode. In this case, the organic emission layer 24 is formed of a hole injection layer (HIL), a hole transport layer (HTL), an emission layer, an electron transport layer (ETL) and an electron injection layer (EIL) sequentially laminated on the pixel electrode 23. Holes and electrons are injected into the organic emission layer 24 from the pixel electrode 23 and the common electrode 21 and light is emitted when excitons generated from combinations of the injected holes and electrons drop from the excited state to the ground state.

The pixel electrode 23 may be formed of a transmissive conductive layer and the common electrode 21 may be formed of a reflective conductive layer. Light emitted from the organic emission layer 24 is reflected by the common electrode 21 and emitted to the outside via the substrate 10. This light emitting structure is referred to as a backlit type. The pixel electrode 23 may be formed of a three-layer film of ITO (indium tin oxide)/Ag/ITO and the common electrode 21 may include Ag or Al.

Referring to FIGS. 9 and 10, a first common power line 221 and a second common power line 222 may be formed at the same level as one of the gate electrode 62 and the source/drain electrodes 63 and 65.

The ends of the first and second common power lines 221 and 222 are extended to the outside of the display unit. At least one of four insulating layers formed in the display unit is extended to the outside of the display unit. For example, the end of the first common power line 221 may be covered with the planarization layer 15 and the end of the second common power line 222 may be covered with the interlayer insulating film 14 and the planarization layer 15.

The planarization layer 15 has a first opening 151 exposing the end of the first common power line 221 and a first pad conductive layer 171 is formed on the planarization layer 15 and connected to the first common power line 221 through the first opening 151. The second pad parts 32 disposed at the longer sides of the substrate 10 in FIGS. 1 and 10 can be defined as the first pad conductive layer 171.

The interlayer insulating film 14 and the planarization layer 15 have a second opening 18 exposing the end of the second common power line 222 and a second pad conductive layer 172 is formed on the planarization layer 15 and connected to the second common power line 222 through the second opening 18. The second pad parts 32 located at the shorter sides of the substrate 10 in FIGS. 1 and 10 can be defined as the second pad conductive layer 172. The first pad conductive layer 171 and the second pad conductive layer 172 may be formed at the same level as the pixel electrode 23 and made of the same material as the pixel electrode 23.

Referring to FIG. 11, the common electrode 21 is disposed inside the bonding layer 34 and the first pad parts 31 are formed over the inside and outside the bonding layer 34 to connect the common electrode 21 and the conductive contact layer 35. The first pad parts 31 include a third pad conductive layer 173, a fourth pad conductive layer 174 and a fifth pad conductive layer 175.

The third pad conductive layer 173 is disposed inside the bonding layer 34 and comes into contact with the common electrode 21. The fourth pad conductive layer 174 is connected to the third pad conductive layer 173 through a third opening 153 formed in the planarization layer 15 and disposed over the inside and outside of the bonding layer 34. The fifth pad conductive layer 175 is disposed between the conductive contact layer 35 and the planarization layer 15 and connected to the fourth pad conductive layer 174 through a fourth contact hole 154 formed in the planarization layer 15.

The third and fifth pad conductive layers 173 and 175 may be formed at the same level as the pixel electrode 23 and formed of the same material as the pixel electrode 23. The fourth pad conductive layer 174 may be formed at the same level as the source/drain electrodes 63 and 64 and formed of the same material as the source/drain electrodes 63 and 64. The detailed structure of the first pad parts 31 is not limited to the shown example and any structure that can electrically connect the common electrode 21 of the display unit and the conductive contact layer 35 formed outside the display unit can be used.

The display unit shown in FIGS. 9, 10 and 11 is and is not limited to the shown example and the structures of the thin film transistor 60 and the organic light emitting element 25 can be varied.

While the disclosed embodiments have been described in connection with the accompanying drawings, it is to be understood that the disclosed embodiments are not considered limiting, but, on the contrary, is intended to cover various modifications and equivalent arrangements included within the spirit and scope of the appended claims.

What is claimed is:

1. An organic light emitting diode (OLED) display comprising:
    a substrate;
    a display unit formed over the substrate and comprising a plurality of pixels;
    a conductive contact layer formed separated from and so as to surround the display unit;
    a sealing member facing the display unit and connected to the conductive contact layer,
    wherein the sealing member comprises:
    a flexible polymer film; and
    a metal layer formed over at least one side of the polymer film, contacting the conductive contact layer and electrically connected to the display unit via the conductive contact layer.

2. The OLED display of claim 1, wherein the polymer film has a thickness in the range of about 1 μm to about 300 μm.

3. The OLED display of claim 1, wherein the display unit has a diagonal length greater than about 700 mm.

4. The OLED display of claim 1, wherein the conductive contact layer surrounds the display unit, and wherein a bonding layer, a getter layer and a moisture-absorbing filler are disposed inside the conductive contact layer.

5. The OLED display of claim 1, wherein the display unit comprises a common electrode and a common power line, and wherein and a first pad part electrically connected to the common electrode and a second pad part electrically connected to the common power line are formed between the conductive contact layer and the substrate.

6. The OLED display of claim 5, wherein the conductive contact layer is conductive in the thickness direction of the substrate and is non-conductive in other directions.

7. The OLED display of claim 5, wherein the sealing member comprises i) a first metal layer disposed over the inner side of the polymer film and electrically connected to the first pad part via the conductive contact layer and ii) a second metal layer disposed over the inner side of the polymer film and at a location where the first metal layer is not formed and electrically connected to the second pad part via the conductive contact layer.

* * * * *